(12) United States Patent
Chang et al.

(10) Patent No.: US 11,495,606 B2
(45) Date of Patent: Nov. 8, 2022

(54) FINFET HAVING NON-MERGING EPITAXIALLY GROWN SOURCE/DRAINS

(71) Applicant: Taiwan Semiconductor Manufacturing Co., Ltd., Hsinchu (TW)

(72) Inventors: Chun Po Chang, Pingtung (TW); Chen-Ming Lee, Yangmei (TW); Fu-Kai Yang, Hsinchu (TW); Mei-Yun Wang, Chu-Pei (TW); Wei-Yang Lee, Taipei (TW); Tzu-Hsiang Hsu, Xinfeng Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 150 days.

(21) Appl. No.: 17/106,457

(22) Filed: Nov. 30, 2020

(65) Prior Publication Data
US 2021/0082925 A1    Mar. 18, 2021

Related U.S. Application Data

(62) Division of application No. 15/941,074, filed on Mar. 30, 2018, now Pat. No. 10,854,615.

(51) Int. Cl.
*H01L 29/66* (2006.01)
*H01L 27/11* (2006.01)
*H01L 29/06* (2006.01)
*H01L 29/08* (2006.01)
*H01L 29/78* (2006.01)

(52) U.S. Cl.
CPC ...... *H01L 27/1104* (2013.01); *H01L 29/0649* (2013.01); *H01L 29/0847* (2013.01); *H01L 29/6681* (2013.01); *H01L 29/785* (2013.01)

(58) Field of Classification Search
CPC ................................. H01L 29/66795
USPC ........................................ 438/197
See application file for complete search history.

(56) References Cited

U.S. PATENT DOCUMENTS

| | | | |
|---|---|---|---|
| 7,425,740 B2 | 9/2008 | Liu et al. |
| 7,667,271 B2 | 2/2010 | Yu et al. |
| 7,910,453 B2 | 3/2011 | Xu et al. |
| 8,048,723 B2 | 11/2011 | Chang et al. |
| 8,053,299 B2 | 11/2011 | Xu |
| 8,183,627 B2 | 5/2012 | Currie |

(Continued)

FOREIGN PATENT DOCUMENTS

| | | |
|---|---|---|
| TW | 201626575 A | 7/2016 |
| TW | 201712763 A | 4/2017 |

*Primary Examiner* — Hsin Yi Hsieh
(74) *Attorney, Agent, or Firm* — Haynes and Boone, LLP

(57) ABSTRACT

A semiconductor device includes a layer having a semiconductive material. The layer includes an outwardly-protruding fin structure. An isolation structure is disposed over the layer but not over the fin structure. A first spacer and a second spacer are each disposed over the isolation structure and on sidewalls of the fin structure. The first spacer is disposed on a first sidewall of the fin structure. The second spacer is disposed on a second sidewall of the fin structure opposite the first sidewall. The second spacer is substantially taller than the first spacer. An epi-layer is grown on the fin structure. The epi-layer protrudes laterally. A lateral protrusion of the epi-layer is asymmetrical with respect to the first side and the second side.

20 Claims, 11 Drawing Sheets

(56) References Cited

U.S. PATENT DOCUMENTS

| | | |
|---|---|---|
| 8,362,575 B2 | 1/2013 | Kwok et al. |
| 8,367,498 B2 | 2/2013 | Chang et al. |
| 8,377,779 B1 | 2/2013 | Wang |
| 8,399,931 B2 | 3/2013 | Liaw et al. |
| 8,415,718 B2 | 4/2013 | Xu |
| 8,440,517 B2 | 5/2013 | Lin et al. |
| 8,487,378 B2 | 7/2013 | Goto et al. |
| 8,497,177 B1 | 7/2013 | Chang et al. |
| 8,497,528 B2 | 7/2013 | Lee et al. |
| 8,609,518 B2 | 12/2013 | Wann et al. |
| 8,610,240 B2 | 12/2013 | Lee et al. |
| 8,618,556 B2 | 12/2013 | Wu et al. |
| 8,633,516 B1 | 1/2014 | Wu et al. |
| 8,652,894 B2 | 2/2014 | Lin et al. |
| 8,680,576 B2 | 3/2014 | Ching et al. |
| 8,686,516 B2 | 4/2014 | Chen et al. |
| 8,703,565 B2 | 4/2014 | Chang et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,742,509 B2 | 6/2014 | Lee et al. |
| 8,772,109 B2 | 7/2014 | Colinge |
| 8,776,734 B1 | 7/2014 | Roy et al. |
| 8,785,285 B2 | 7/2014 | Tsai et al. |
| 8,796,666 B1 | 8/2014 | Huang et al. |
| 8,796,759 B2 | 8/2014 | Perng et al. |
| 8,809,139 B2 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,826,213 B1 | 9/2014 | Ho et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,887,106 B2 | 11/2014 | Ho et al. |
| 9,105,490 B2 | 8/2015 | Wang et al. |
| 10,269,932 B1 * | 4/2019 | Arya .................. H01L 29/0847 |
| 2011/0068407 A1 | 3/2011 | Yeh et al. |
| 2013/0011983 A1 | 1/2013 | Tsai et al. |
| 2013/0285153 A1 | 10/2013 | Lee et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0183600 A1 | 7/2014 | Huang et al. |
| 2014/0252412 A1 | 9/2014 | Tsai et al. |
| 2014/0264590 A1 | 9/2014 | Yu et al. |
| 2014/0264592 A1 | 9/2014 | Oxland et al. |
| 2014/0282326 A1 | 9/2014 | Chen et al. |
| 2015/0263003 A1 | 9/2015 | Lee et al. |
| 2017/0207126 A1 | 7/2017 | Ching et al. |

* cited by examiner

FINFET HAVING NON-MERGING EPITAXIALLY GROWN SOURCE/DRAINS

PRIORITY DATA

This application is a divisional application of U.S. patent application Ser. No. 15/941,074, filed Mar. 30, 2018, the entirety of which is herein incorporated by reference.

BACKGROUND

In deep sub-micron integrated circuit technology, an embedded static random access memory (SRAM) device has become a popular storage unit of high speed communication, image processing and system-on-chip (SOC) products. The amount of embedded SRAM in microprocessors and SOCs increases to meet the performance requirement in each new technology generation. As silicon technology continues to scale from one generation to the next, the impact of intrinsic threshold voltage (Vt) variations in minimum geometry size bulk planar transistors reduces the complimentary metal-oxide-semiconductor (CMOS) SRAM cell static noise margin (SNM). This reduction in SNM caused by increasingly smaller transistor geometries is undesirable. SNM is further reduced when Vcc is scaled to a lower voltage.

To solve SRAM issues and to improve cell shrink capability, fin field effect transistor (FinFET) devices are often considered for some applications. The FinFET provides both speed and device stability. The FinFET has a channel (referred to as a fin channel) associated with a top surface and opposite sidewalls. Benefits can be derived from the additional sidewall device width ($I_{on}$ performance) as well as better short channel control (sub-threshold leakage). Therefore, FinFETs are expected to have advantages in terms of gate length scaling and intrinsic $V_t$ fluctuation. However, existing FinFET SRAM devices still have shortcomings, for example shortcomings caused by undesirable merging of the source/drain epi-layers, or by metal contact landing problems. When these problems occur, FinFET SRAM performance and/or reliability may be degraded.

Therefore, although existing FinFET SRAM devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
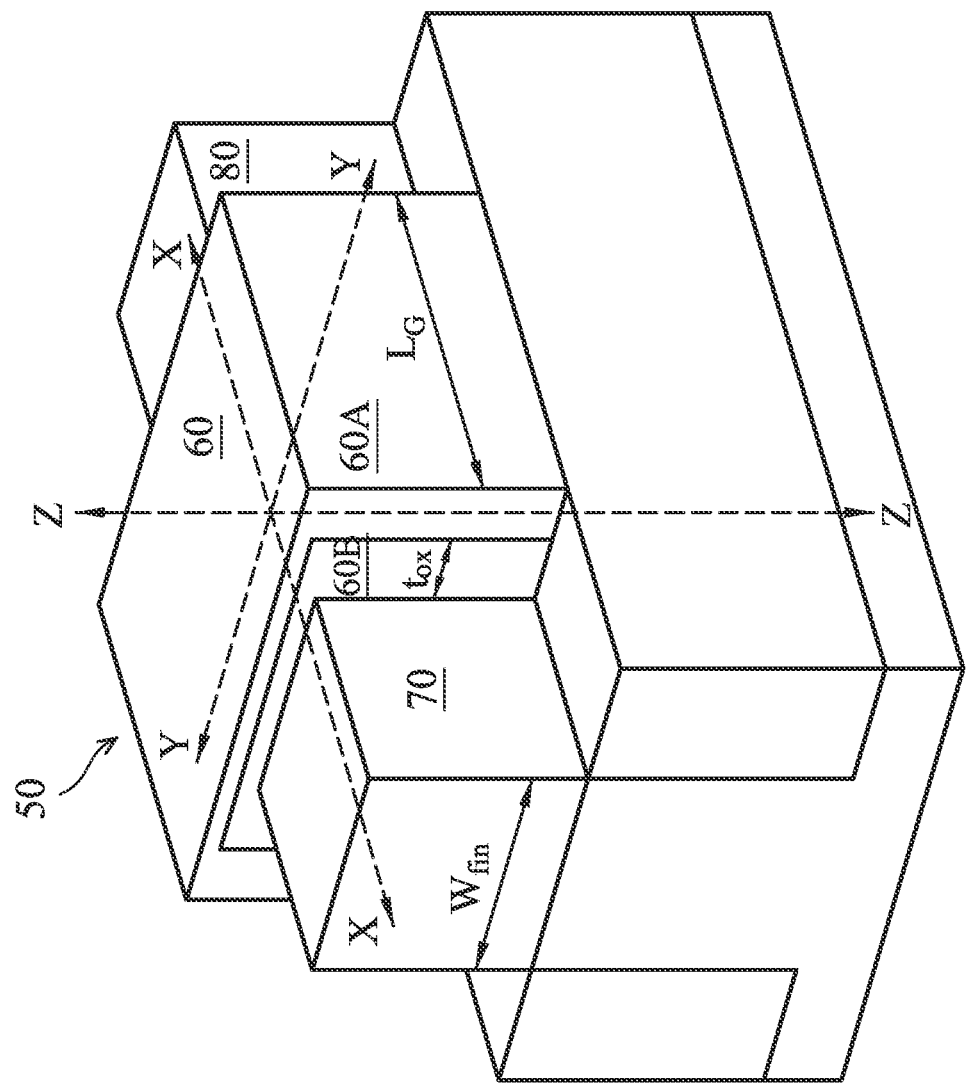
FIG. 1 is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

LG denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip. According to the various aspects of the present disclosure, FinFET devices may be used to implement Static Random-Access Memory (SRAM) devices.

According to the various aspects of the present disclosure, the source/drain epi-layers of FinFET devices can be grown to have increased lateral dimensions, so as to maximize the metal contact landing window. At the same time, the present disclosure prevents the unintentional merging between the source/drain epi-layers for adjacent transistors of an SRAM device, thereby reducing bridging risks, as discussed in more detail below.

FIGS. 2-6 illustrate fragmentary cross-sectional views of a portion of a semiconductor device 100 at different stages of fabrication according to an embodiment of the present disclosure. The semiconductor device 100 includes FinFET transistors and is a part of an SRAM device. The cross-sectional view of FIGS. 2-6 is obtained by "cutting" the FinFET transistors along the Y-direction shown in FIG. 1, and thus the cross-sectional views in FIGS. 2-6 may be referred to as a Y-cut view. It is understood that the Y-cut is also taken at a location outside the gate 60, for example on a portion of the source 70 or drain 80 that is not wrapped under the gate 60 in FIG. 1. Hence, the gate is not directly visible in FIGS. 2-6.

Figure 2:
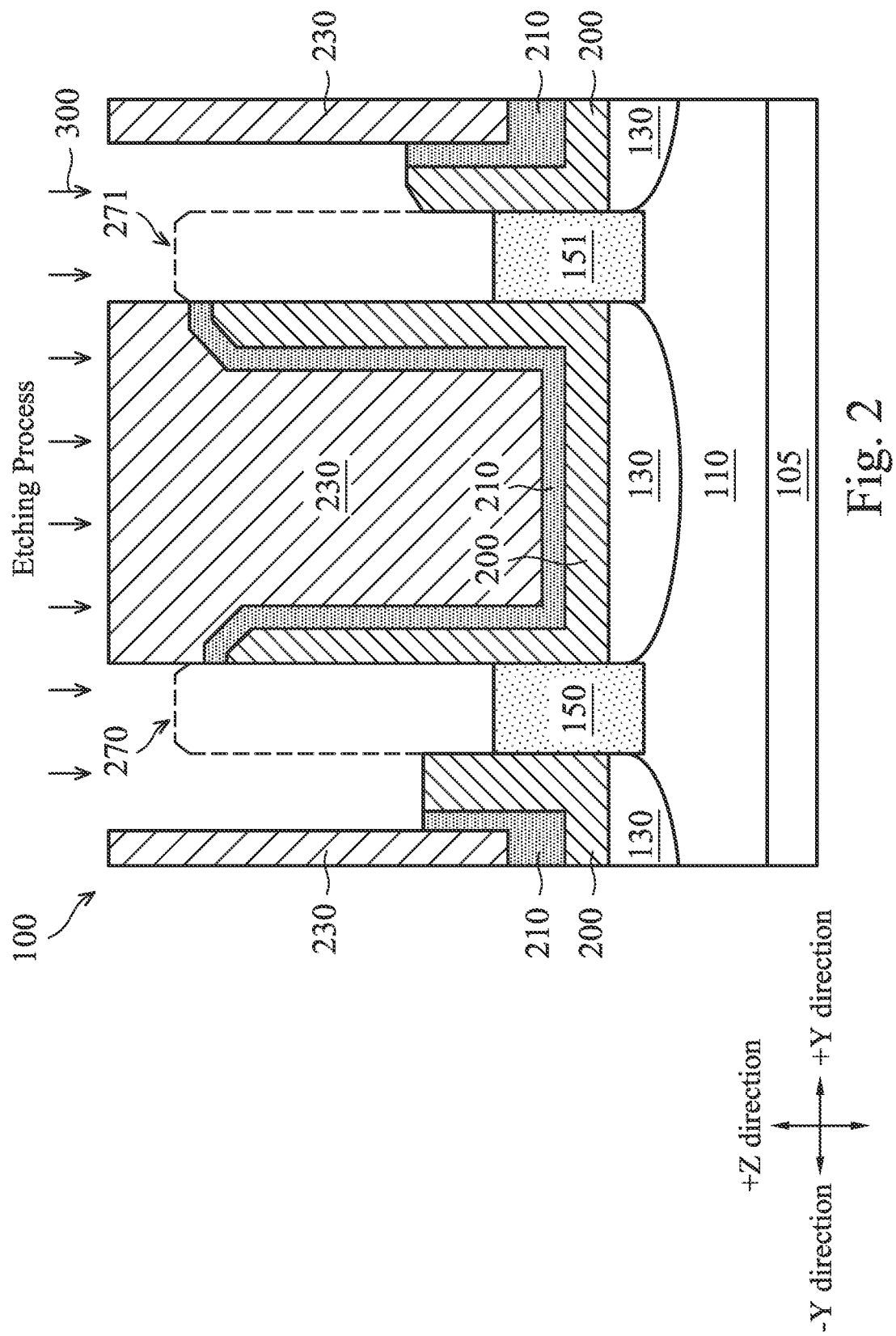
FIGS. 2-6 illustrate cross-sectional side views of a FinFET SRAM device at various stages of fabrication according to embodiments of the present disclosure.

Referring to FIG. 2, the semiconductor device 100 is fabricated over a substrate 105. In some embodiments, the substrate 105 includes a dielectric material, for example silicon oxide ($SiO_2$). In some other embodiments, the substrate 105 includes a semiconductive material, for example silicon. Other suitable materials may also be used for the substrate in alternative embodiments.

The semiconductor device 100 includes a semiconductive layer 110. The semiconductive layer 110 includes a semiconductive material. For example, in an embodiment, the semiconductive layer 110 includes a crystal silicon material. An implantation process (e.g., an anti-punch-through implantation process) may be performed to implant a plurality of dopant ions to the semiconductive layer 110. The dopant ions may include an n-type material in some embodiments, for example arsenic (As) or phosphorous (P), or they may include a p-type material in some other embodiments, for example boron (B), depending on whether an NMOS (or nFET) or a PMOS (or pFET) is needed.

Isolation structures 130 such as shallow trench isolations (STIs) are formed over the semiconductive layer 110. The isolation structures 130 may include a dielectric material, such as silicon oxide, silicon nitride, silicon oxynitride, or combinations thereof. The isolation structures 130 provide electrical isolation between various microelectronic components of the semiconductor device 100.

The semiconductor device 100 includes fin structures such as fin structures 150-151 that each protrude vertically upwards in the Z-direction. The fin structure 151 is located to the "right" (i.e., in the +Y direction) of the fin structure 150, and the fin structure 150 is located to the "left" (i.e., in the -Y direction) of the fin structure 151. Though the fin structures 150-151 are spaced apart from each other, they may still be considered "adjacent" fin structures. The fin structures 150-151 may be formed by patterning the semiconductive layer 110 (prior to the formation of the isolation structures 130). As such, the fin structures 150-151 may have the same material composition as the semiconductive layer 110. The isolation structures 130 are formed on the sidewalls of the fin structures 150-151, but portions of the fin structures 150-151 still protrude out of the isolation structures 130. In other words, at least a portion of each fin structure 150-151 is not covered by the isolation structures 130. It is understood that for real world devices, the fin structures 150-151 may not have a perfectly flat or smooth top surface.

A gate structure (not directly visible in FIG. 2) is formed to wrap around each of the fin structures 150-151, for example in a manner similar to what is shown in FIG. 1. In some embodiments, the gate structure may be a dummy gate structure. The dummy gate structure may be formed by one or more patterning processes. For example, a polysilicon material may be formed over the isolation structures 130. A patterned hard mask is formed over the polysilicon material and is then used to pattern (e.g., by one or more etching processes) the polysilicon material below to form a dummy gate electrode of the dummy gate structure. The dummy gate electrode will be replaced by a functional gate electrode (that contains metal) in a later process known as a gate-replacement process. The dummy gate structure may also include a dummy gate dielectric layer that is disposed below the dummy gate electrode layer. For example, the dummy gate dielectric layer may include silicon oxide. The dummy gate dielectric layer will also be removed and replaced in the gate-replacement process, for example replaced by a high-k gate dielectric layer.

The semiconductor device 100 may also include spacers. For example, a spacer layer 200 may be formed over the fin structures 150-151. The spacer layer 200 may include a dielectric material, such as a low-k dielectric material (a dielectric material with a dielectric constant smaller than that of silicon dioxide). As non-limiting examples, the low-k dielectric material may include fluorine-doped silicon dioxide, carbon-doped silicon dioxide, porous silicon dioxide, porous carbon-doped silicon dioxide, spin-on organic polymeric dielectrics, spin-on silicon based polymeric dielectrics, or combinations thereof. The spacer layer 200 may be formed by a suitable deposition technique and is formed on the sidewalls of the fin structures 150-151 and on the upper surfaces of the isolation structures 130.

A spacer layer 210 may also be formed over the spacer layer 200. The spacer layer 210 has a different material composition than the spacer layer 200. For example, in embodiments where the spacer layer 200 includes a low-k dielectric material, the spacer layer 210 may include silicon nitride. In other embodiments, the spacer layer 210 may also include silicon oxide, silicon oxynitride, or combinations thereof. One reason for having two spacer layers 200 and 210 (which have different material compositions) is that, the material composition (e.g., low-k) of the spacer layer 200 is configured so as to reduce parasitic capacitance for the final transistor device, while the material composition of the spacer layer 210 is configured be sturdy (e.g., silicon nitride) to protect the spacer layer 200 during certain fabrication processes. For example, during an epi-growth process discussed below, if the spacer layer 210 is not present to protect the spacer layer 200, the spacer layer 200 may be inadvertently or unintentionally damaged. Thus, the spacer layer 210 may be eventually removed (e.g., after the epi-growth process) after making sure that the spacer layer 200 will not be damaged.

As shown in FIG. 2, a patterned photoresist layer 230 is formed over the semiconductor device 100. The patterned photoresist layer 230 may be formed by spin coating a photoresist material, followed by processes such as exposing the photoresist material, developing the photoresist material, baking the photoresist material, etc. In some embodiments, the photoresist material may include a tri-layer photoresist, which includes a bottom layer, a middle layer disposed over the bottom layer, and a top layer disposed over the middle layer. The bottom layer, middle layer, and the top layer may also have different material compositions from one another. It is also understood that in some embodiments, the patterned photoresist layer 230 may be formed using an extreme ultraviolet (EUV) lithography tool, which uses a laser-driven plasma light source, and uses reflective optics with multilayer mirrors.

According to the various aspects of the present disclosure, a portion of the patterned photoresist layer 230 is formed between the two adjacent fin structures 150-151 (e.g., formed over the spacer layer 210). This portion of the patterned photoresist layer 230 also covers up portions of the spacer layers 200-210 that are disposed between the adjacent fin structures 150-151. The patterned photoresist layer 230 therefore defines an opening 270 and an opening 271. The opening 270 is located over, and exposes, the fin structure 150 and portions of the spacer layers 200-210 that are disposed to the "left" (i.e., in the −Y direction) of the fin structure 150. The opening 271 is located over, and exposes, the fin structure 151 and portions of the spacer layers 200-210 that are disposed to the "right" (i.e., in the +Y direction) of the fin structure 151. The covering up of the spacer layers 200-210 to one side (but not the other side) of the fin structures 150 and 151 is intentional, as this will help prevent undesirable merging between source/drain epi-layers that are grown over the fin structures 150-151 in a later process, as discussed below in more detail.

Still referring to FIG. 2, after the patterned photoresist layer 230 has been formed, one or more etching processes 300 are performed to the semiconductor device 100. The patterned photoresist layer 230 serves as an etching mask during the etching process 300 by protecting portions of the semiconductor device 100 underneath from being etched, while the portions of the semiconductor device 100 unprotected (e.g., exposed by the openings 270-271) by the patterned photoresist layer 230 are etched away. As a result of the etching process 300, the height (in the Z-direction) of the fin structures 150-151 is reduced. The profiles/outlines of the original fin structures 150-151 (prior to the etching process 300) are represented as dashed lines in FIG. 2.

The height of the spacer layers 200-210 that are exposed by the openings 270-271 is also reduced. For example, prior to the etching process 300, the height of the spacer layers 200-210 to the "left" of the fin structure 150 is substantially the same as the height of the spacer layers 200-210 to the "right" of the fin structure 150, and the same is true for the fin structure 151. However, since some portions of the spacer layers 200-210 are exposed by the openings 270-271, while other portions of the spacer layers 200-210 are protected by the patterned photoresist layer 230, the height of the exposed portions of the spacer layers 200-210 is now substantially shorter than the height of the protected portions of the spacer layers 200-210. This uneven height of the spacer layers 200-210 allows for the growth of the source/drain epi-layers in one lateral direction (i.e., toward the direction with the shorter spacer layers) but not the other, as discussed in more detail below. It is understood that the fin structures 150-151 and the spacer layers 200-210 may be etched in the same etching process in some embodiments. In other embodiments, the fin structures 150-151 may be etched in one etching process of the etching processes 300, while the spacer layers 200-210 may be etched in a different etching process of the etching processes 300.

Figure 3:
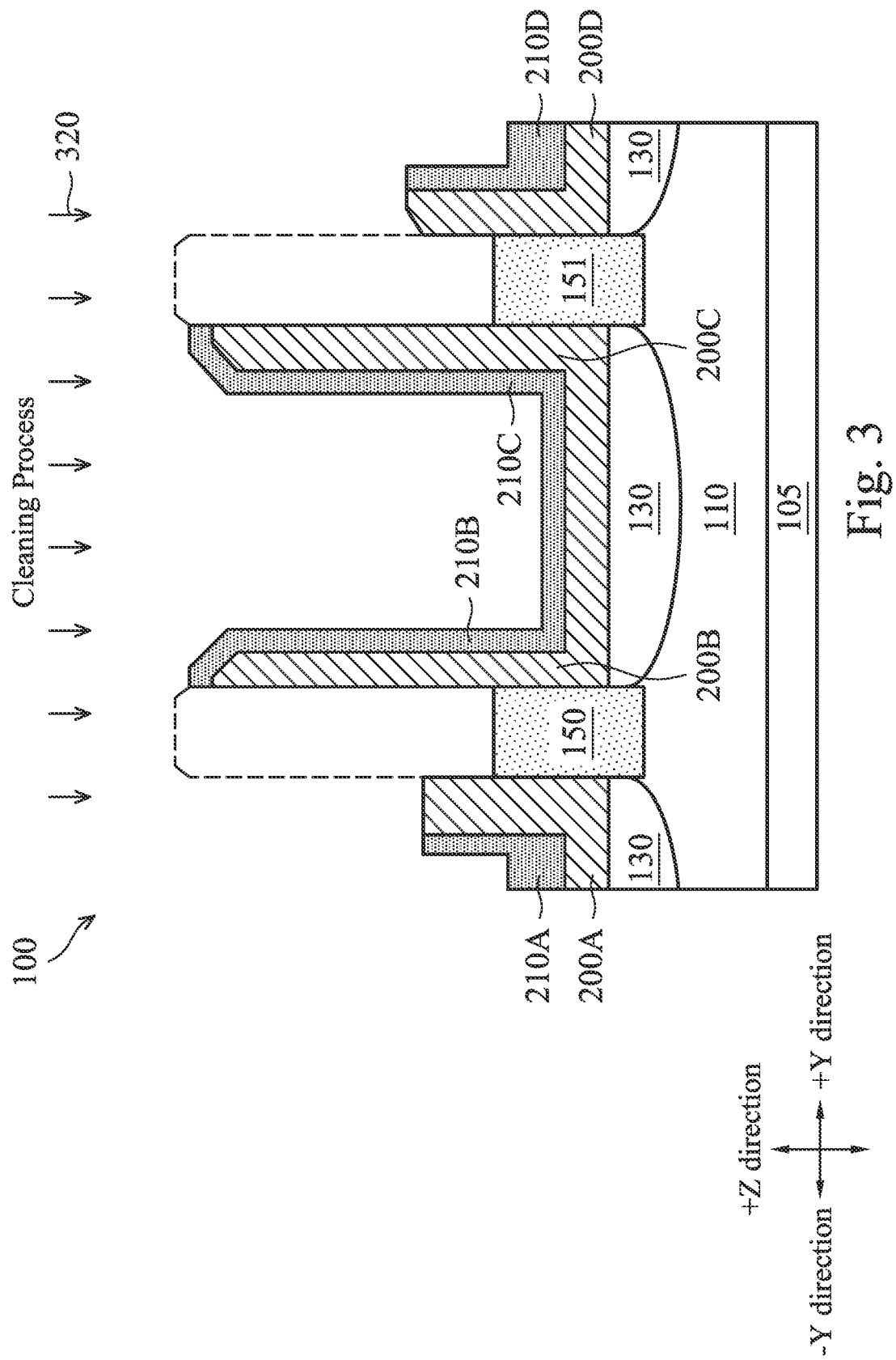

Referring now to FIG. 3, the patterned photoresist layer 230 is removed, for example through a photoresist stripping or ashing process. A cleaning process 320 is then performed to the semiconductor device 100. The cleaning process 320 cleans the exposed portions of the fin structures 150 and 151, for example by removing contaminants. This allows the fin structures 150 and 151 to have better epitaxial growth in a subsequent process.

As shown in FIG. 3, the remaining portions of the spacer layers 200-210 include a plurality of segments that may be considered individual spacers. For example, a spacer 200A is formed on the "left" sidewall of the fin structure 150, and a spacer 200B is formed on the "right" sidewall of the fin structure 150. In other words, the spacer 200A is located relative to the fin structure 150 in the −Y direction, while the spacer 200B is located relative to the fin structure 150 in the +Y direction. Similarly, a spacer 200C is formed on the "left" sidewall of the fin structure 151, and a spacer 200D is formed on the "right" sidewall of the fin structure 151. In other words, the spacer 200C is located relative to the fin structure 151 in the −Y direction, while the spacer 200D is located relative to the fin structure 151 in the +Y direction. Spacers 210A, 210B, 210C, and 210D are located on the spacers 200A, 200B, 200C, and 200D, respectively. It is understood that the spacers 200B and 200C may be different segments of the same layer, and that the spacers 210B and 210C may be different segments of the same layer as well. The spacers are labeled individually so that it is easier to refer to them in subsequent discussions.

Figure 4:
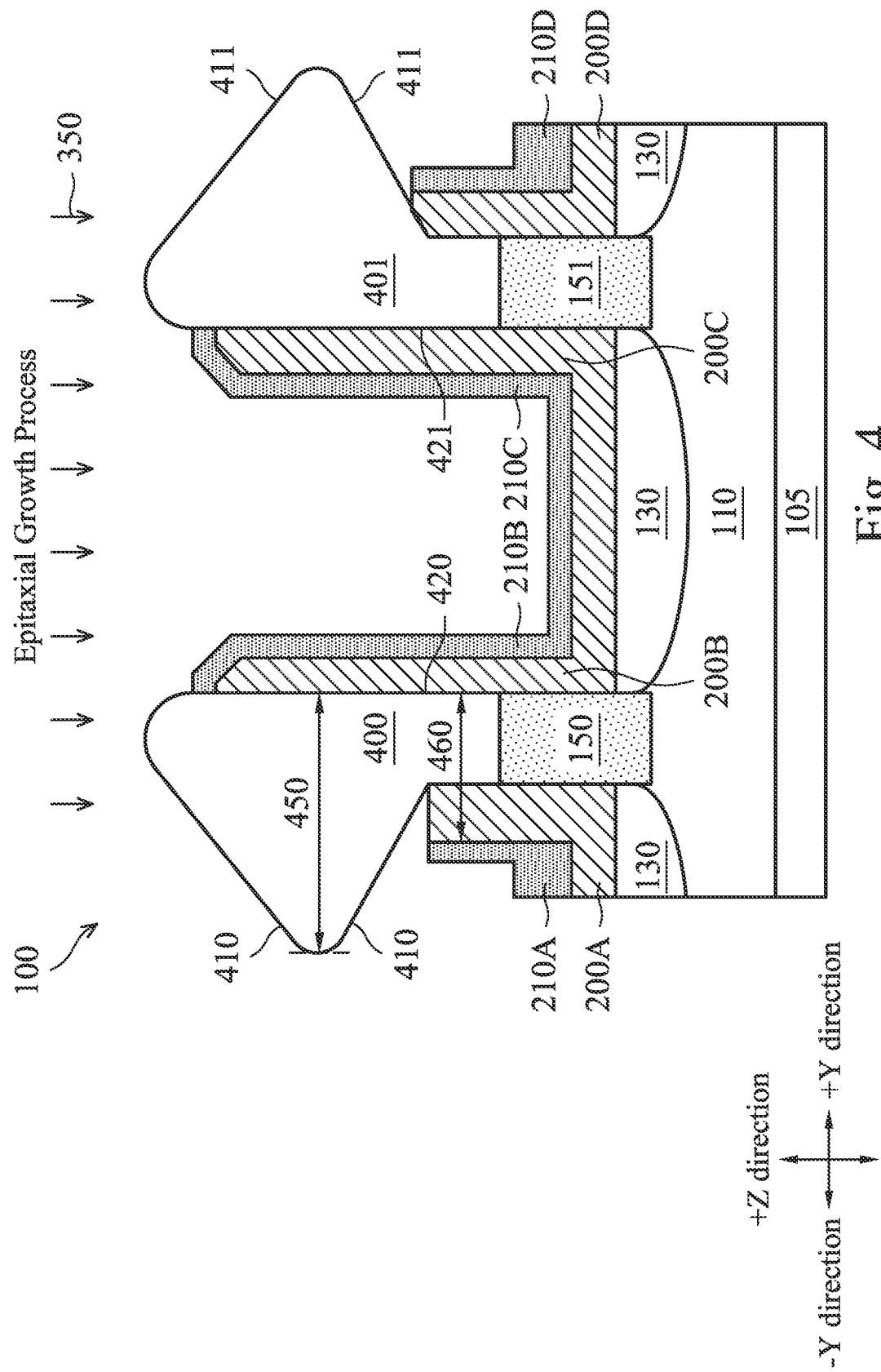

Referring now to FIG. 4, an epitaxial growth process 350 is performed to the semiconductor device 100 to epitaxially grow the source/drain epi-layers 400 and 401 on the fin structures 150 and 151, respectively. In some embodiments, the source/drain epi-layers 400-401 include p-type doped silicon germanium (SiGe), for example doped with Boron. The source/drain epi-layer 400 is epitaxially grown vertically upwards (in the +Z direction) and laterally in the −Y direction, but not in the +Y direction, since the presence of the spacer 200B prevents the lateral epitaxial growth of the source/drain epi-layer 400 in the +Y direction. Similarly, the source/drain epi-layer 401 is epitaxially grown vertically upwards (in the +Z direction) and laterally in the +Y direction, but not in the −Y direction, since the presence of the spacer 200C prevents the lateral epitaxial growth of the source/drain epi-layer 401 in the −Y direction.

The resulting source/drain epi-layers 400 and 401 each have an asymmetrical cross-sectional view profile, which is a physical characteristic of the semiconductor device 100 that distinguishes it from conventional FinFET devices. For example, as shown in FIG. 4, the lateral protrusion of the source/drain epi-layers 400 (or 401) is asymmetrical with respect to its "left side" (i.e., the −Y direction side) and the "right side" (i.e., the +Y direction side). For the source/drain epi-layer 400, it protrudes laterally to the "left side" significantly more than to the "right side", since it hardly protrudes at all to the "right side" due to being blocked by the spacer 200B. Similarly, the source/drain epi-layer 401 protrudes laterally to the "right side" significantly more than to the "left side", since it hardly protrudes at all to the "left side" due to being blocked by the spacer 200C.

In some embodiments, a "left side" surface 410 of the source/drain epi-layer 400 protrudes laterally beyond the leftmost edge of the spacer 210A, while a "right side" surface 420 of the source/drain epi-layer 400 does not protrude laterally beyond the rightmost edge of the spacer 200B. The surface 410 may have a cross-sectional view profile that is wider in the middle but is narrower at the top or bottom (thus defining a lateral protrusion). Meanwhile, the surface 420 may have a cross-sectional view profile that resembles a line, though the line may or may not be substantially straight. In other words, the cross-sectional view profile of the surface 420 may have some curves, dips, protrusions, roughness, or other imperfections (as opposed to a straight line). Nevertheless, the surface 420 is still significantly more linear than the surface 410, which is attributed to the fact that the surface 410 is a result of free and unbounded lateral epitaxial growth, whereas the surface 420 is a result of the lateral epitaxial growth being blocked by the spacer 200B.

The cross-sectional view profile of the source/drain epi-layer 401 may somewhat mirror that of the source/drain epi-layer 400, except that it is "flipped" horizontally in the Y direction. In other words, a "right side" surface 411 of the source/drain epi-layer 401 may have a cross-sectional profile that is wider in the middle but is narrower at the top or bottom (thus defining a lateral protrusion), whereas the "left side" surface 421 of the source/drain epi-layer 401 may have a cross-sectional profile that resembles a straight line, but with the various imperfections such as curvatures, roughness, dips, protrusions, etc.

One benefit for the asymmetrical profiles of the source/drain epi-layers 400 and 401 is that they can improve the metal contact landing window, while at the same time preventing undesirable merging of the epi-layers 400 and 401. In more detail, metal contacts will be formed on the source/drain epi-layers 400 and 401 in a later fabrication stage. These metal contacts provide electrical connectivity to the source/drain regions of the FinFET transistors of the semiconductor device 100. As the feature sizes of semiconductor fabrication continue to get scaled down, the source/drain epi-layers are shrunk too, for example with a reduced lateral dimension. The reduced lateral dimension makes it more difficult for the metal contacts to accurately "land" on the epi-layers 400/401. In other words, the metal contact landing window may be small. Thus, it may be beneficial to increase the lateral dimensions of the epi-layers 400 and 401, so as to enlarge the metal contact landing window.

Unfortunately, for conventional devices, increasing the lateral dimensions of the epi-layers 400 and 401 could lead to the unintentional merging between the epi-layers 400 and 401. This is because the conventional devices do not specifically reserve a portion of the spacer layers (e.g., the spacers 200B/200C and 210B/210C) in between the epi-layers 400 and 401, thus allowing the epitaxial growth of the epi-layers 400 and 401 to continue until they are merged together laterally. The merging of the epi-layers 400 and 401 could be problematic. For example, for SRAM devices, the merging of the epi-layers 400 and 401 may mean the electrical shorting between two inverters, which could render the SRAM device defective.

The present disclosure overcomes the problems associated with the conventional devices by designing the photomask(s) in a manner such that a photoresist mask will cover the spacer layers in between the adjacent fin structures 150 and 151. This ensures that the spacer layers between the adjacent fin structures 150 and 151 are not etched away, and the remaining spacers 200B/200C and 210B/210C can effectively "block" the lateral growth of the source/drain epi-layers 400 and 401 toward each other. In this manner, the undesirable merging of the source/drain epi-layers 400 and 401 is substantially prevented. Meanwhile, the source/drain epi-layers are still allowed to grow laterally in directions facing away from each other, for example in the −Y direction for the source/drain epi-layer 400, and in the +Y direction for the source/drain epi-layer 401.

In some embodiments, the process parameters of the epitaxial growth process 350 may be configured to ensure that a lateral dimension 450 (measured from the outermost portion of the epi-layer 400 and the surface 420) of the epi-layer 400 achieves a certain size, in order to ensure that there is a sufficiently large landing window for the metal contact to be formed subsequently. For example, the epitaxial growth process time may be lengthened compared to conventional epitaxial growth processes. In some embodiments, the lateral dimension 450 is larger than a distance 460 (measured in the Y-direction) between the outermost sidewall of the spacer 200A and the surface 420 of the source/drain epi-layer 400. In some embodiments, the lateral dimension 450 is in a range from about 14 nm to about 23 nm. In some embodiments, the distance 460 is in a range from about 17 nm to about 20 nm.

Figure 5:
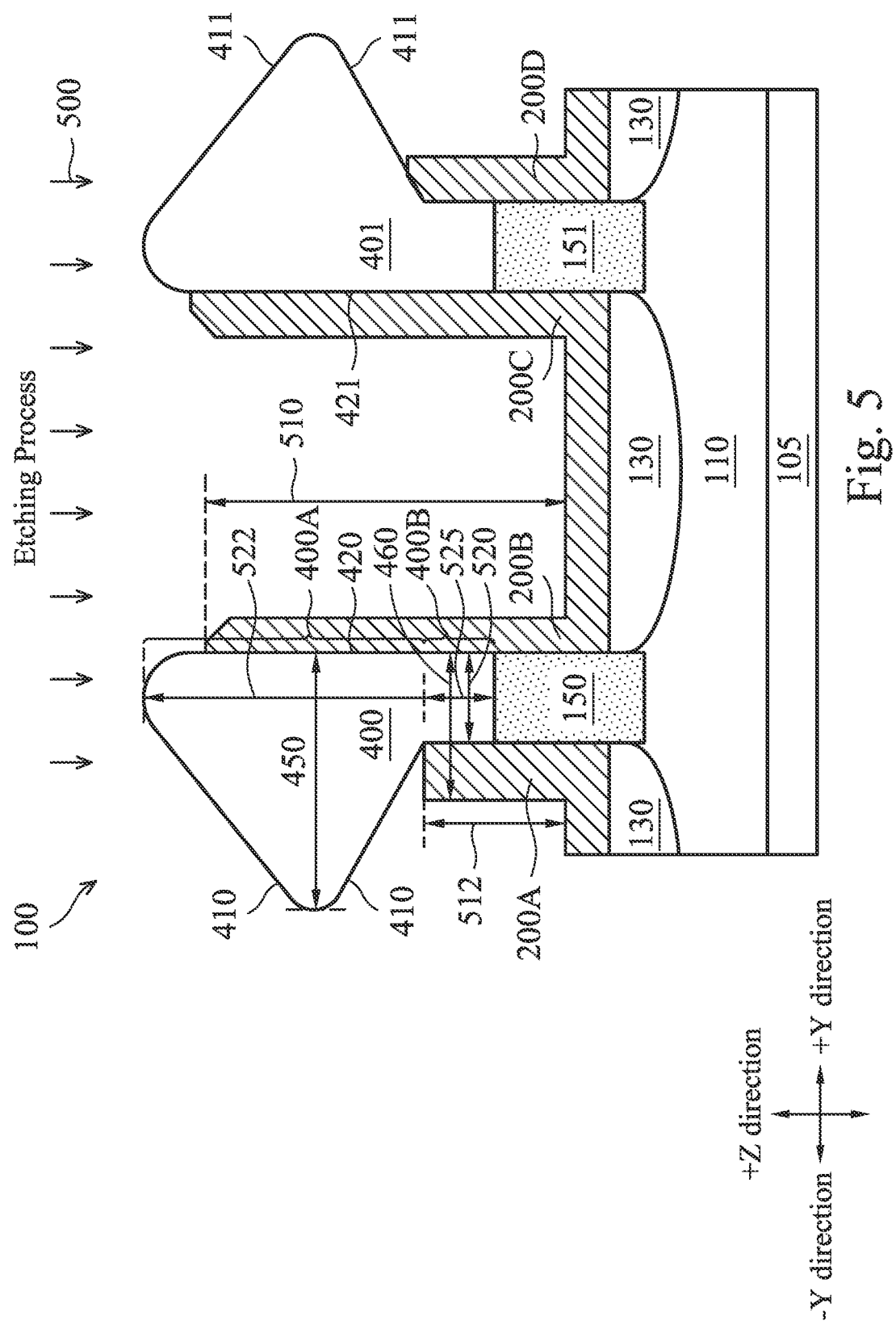

Referring now to FIG. 5, an etching process 500 is performed to the semiconductor device 100. The etching process 500 etches away the spacers 210A/B/C/D, but the spacers 200A/B/C/D remain substantially unetched, due to a sufficiently high etching selectivity (e.g., greater than about 10:1) between the spacers 210A/B/C/D and the spacers 200A/B/C/D. For example, the etching process 500 may use $H_3PO_4$ as an etchant, which is effective at removing the material of the spacers 210A/B/C/D (e.g., SiN), but not effective at removing the material of the spacers 200A/B/C/D (e.g., low-k). At this stage, a height 510 of the spacer 200B (or spacer 200C) is substantially taller than a height 512 of the spacer 200A (or spacer 200D). In some embodiments, a ratio of the height 510 and the height 512 is in a range from about 1.5:1 to about 3.5:1, for example about 2.5:1. It is understood that cleaning processes may be performed before the etching process 500, so as to remove contaminants such as polymer or other residue materials.

At this stage of fabrication, the epi-layer 400 has an upper portion 400A and a lower portion 400B. The upper portion 400A is a portion that is located above the spacers 200A, where the side surfaces of the upper portion 400A are unconfined by the spacer 200A on one side but are confined by the spacer 200B on the opposite side. The lower portion 400B is the portion that is located directly above the fin structure 150, where the side surfaces of the lower portion 400B are in direct physical contact with the spacers 200A or 200B. As shown in FIG. 5, the upper portion 400A has a substantially asymmetrical cross-sectional view profile, while the lower portion 400B has a substantially symmetrical cross-sectional view profile. The same is true for the epi-layer 401.

As discussed above, a widest lateral dimension 450 of the epi-layer 400 is also the lateral dimension of the upper portion 400A. Meanwhile, the lower portion 400B has a lateral dimension 520. In some embodiments, the lateral dimension 520 is in a range from about 8 nm to about 12 nm. It can be seen from FIG. 5 that the lateral dimension 450 is substantially greater than the lateral dimension 520, even though the upper portion 400A and the lower portion 400B share the same side surface 420 on the "right side". This is because the upper portion 400A has a significant lateral protrusion in the −Y direction but not in the +Y direction, due to the unique fabrication processing steps discussed above, while the lower portion 400B is confined by the spacers 200A/200B on both sides so that it does not protrude laterally in either the −Y or +Y direction. The significantly greater lateral dimension 450 (compared to the lateral dimension 520) is another manifestation of the asymmetrical characteristic of the epi-layer 400. In some embodiments, a ratio of the lateral dimension 450 and the lateral dimension 520 is expressed as R1, where R1 is in a range from about 1.5:1 to about 3:1, for example about 2:1. The upper portion 400A also has a maximum height (e.g., vertical dimension) 522, whereas the lower portion 400B has a maximum height (e.g., vertical dimension) 525. Although it may not be readily apparent from FIG. 5 (since it is not drawn in scale), the height 525 may be equal to, or greater than, the height 522. In some embodiments, the height 522 is in a range from about 10 nm to about 15 nm, while the height 525 is in a range from about 10 nm to about 30 nm. In some embodiments, a ratio of the height 522 and the height 525 is expressed as R2, where R2 is in a range from about 1:1 to about 1:2, for example about 1:1.5.

Figure 6:
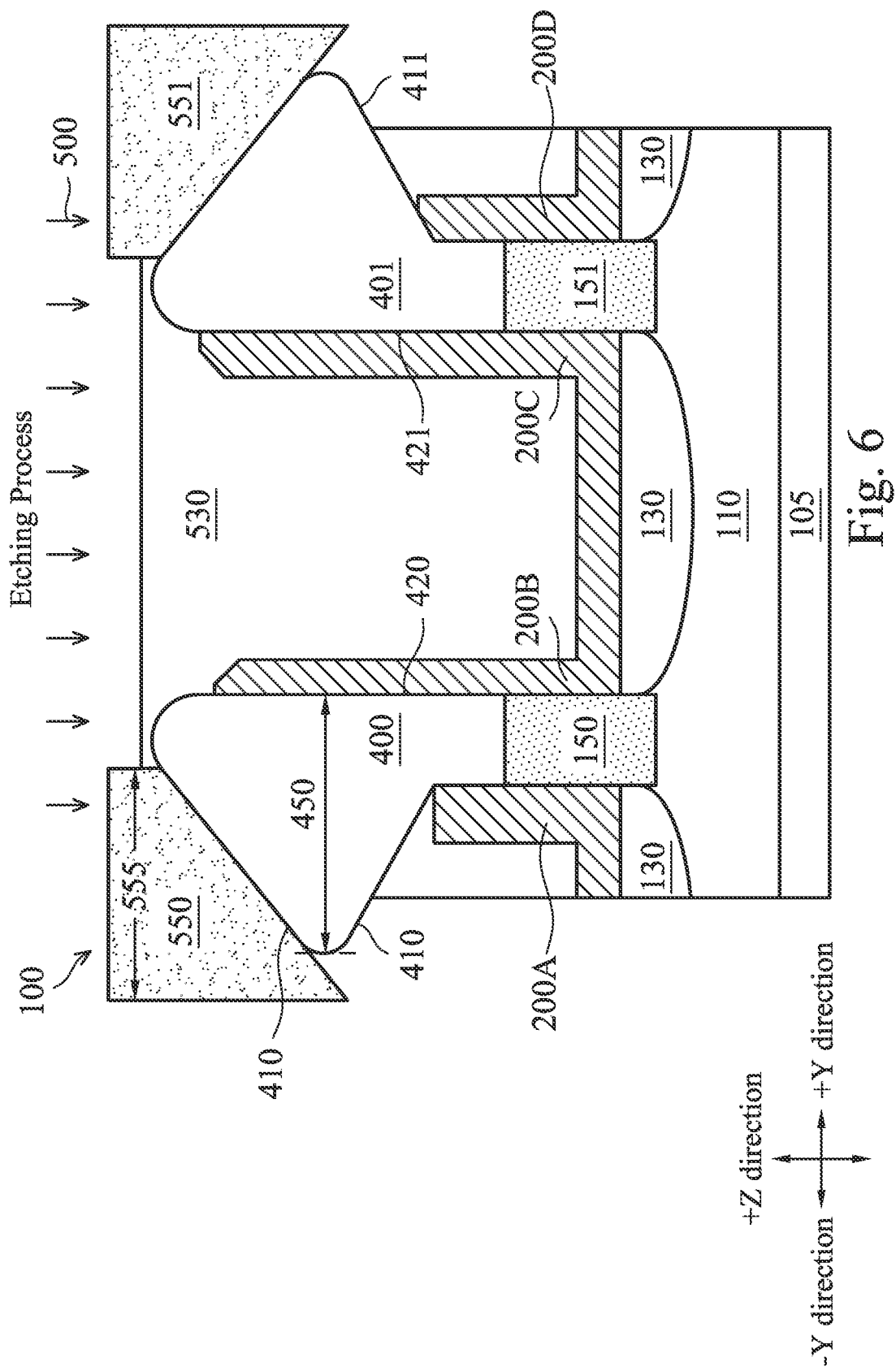

Referring now to FIG. 6, an isolation structure 530 is formed over the spacers 200A/B/C/D and over the source/drain epi-layers 400-401. In some embodiments, the isolation structure 530 includes a dielectric material, such as a low-k dielectric material or silicon oxide. The isolation structure 530 may also be referred to as an interlayer dielectric (ILD). The isolation structure may be formed by a suitable deposition process followed by a polishing process such as chemical-mechanical-polishing (CMP), so as to planarize the upper surface of the isolation structure.

Note that although the gate structures of the FinFET transistors are not directly visible in FIG. 6, the isolation structure 530 is also formed over the gate structures. As discussed above, the gate structures may be dummy gate structures that are removed in a gate replacement process. For example, in the gate replacement process, the dummy gate structure (including a polysilicon dummy gate electrode and/or a silicon oxide dummy gate dielectric) is removed using one or more etching processes, therefore leaving an opening in the isolation structure 530 in place of the removed dummy gate structure. The opening is then filled with a high-k gate dielectric (if a high-k gate dielectric was not formed already) and a metal gate electrode. A high-k dielectric material is a material having a dielectric constant that is greater than a dielectric constant of $SiO_2$, which is approximately 4. In an embodiment, the high-k gate dielectric includes hafnium oxide ($HfO2$), which has a dielectric constant that is in a range from approximately 18 to approximately 40. In alternative embodiments, the high-k gate dielectric may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO. The metal gate electrode may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure. In various embodiments, the fill metal component may contain Aluminum (Al), Tungsten (W), Copper (Cu), or combinations thereof.

Still referring to FIG. 6, metal contacts are also formed for the semiconductor device 100. For example, a metal contact 550 is formed over the source/drain epi-layer 400, and a metal contact 551 is formed over the source/drain epi-layer 401. The metal contacts 550 and 551 provide electrical connectivity to the source/drain regions of the FinFET transistors. In some embodiments, the metal contacts 550/551 may each have a lateral dimension (measured in the Y-direction) 555 that is in a range from about 30 nm to about 50 nm. In some embodiments, the lateral dimension 555 is greater than the lateral dimension 450 of the epi-layers 400/401. As discussed above, since the source/drain epi-layers 400 and 401 are free to grow laterally without risks of merging, the lateral dimensions of the source/drain 400 and 401 may be configured sufficiently large to accommodate the metal contacts 550 and 551, respectively. The metal contacts 550 and 551 may still "land" on the source/drain epi-layers 400 and 401 even if there is some lateral shifting of the positions of the metal contacts 550 and 551. As such, the metal contact landing window is increased. At the same time, the source/drain epi-layers 400 and 401 are physically separated from each other by the isolation structure 530, and thus the inverters of the SRAM device are not electrically shorted together. It is understood that metal contacts may also be formed over the functional gate structure to provide electrical connectivity to the gate of the FinFET transistors.

Figure 7A:
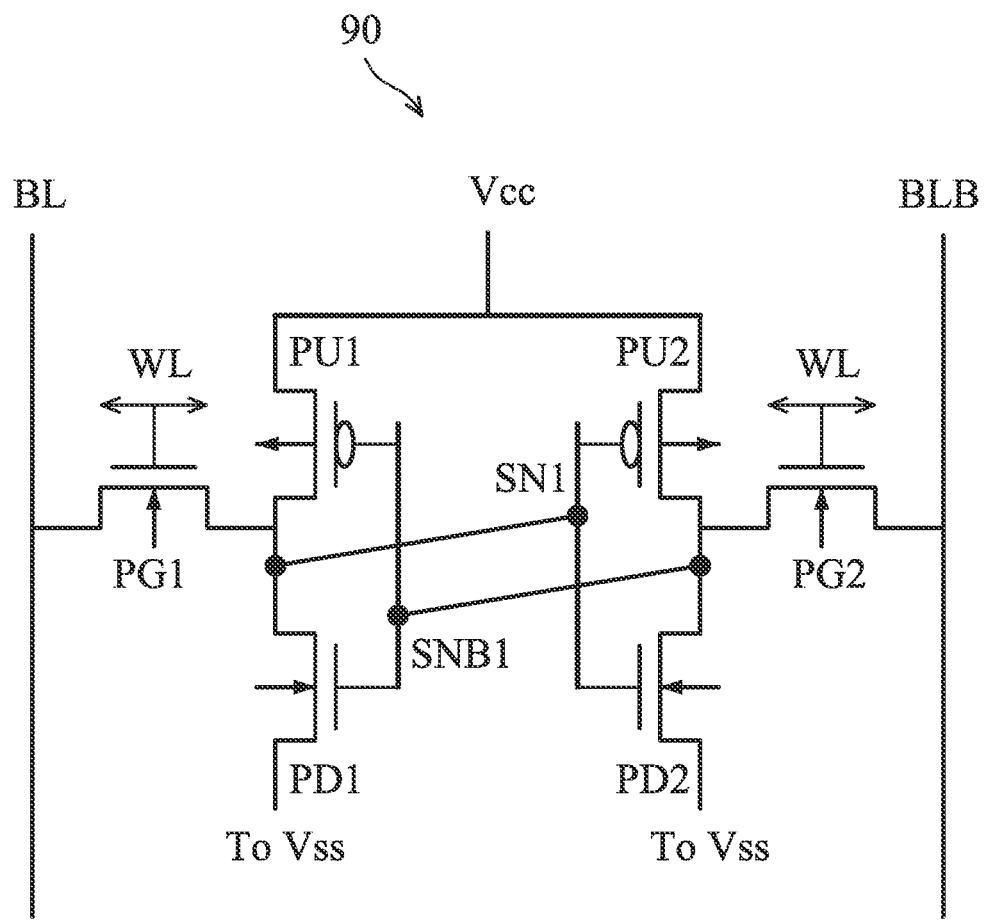
FIG. 7A illustrates a circuit schematic for a 1-bit SRAM cell according to an embodiment of the present disclosure.

FIG. 7A illustrates a circuit schematic for a single-port SRAM cell (e.g., 1-bit SRAM cell) 90. The single-port SRAM cell 90 includes pull-up transistors PU1, PU2; pull-down transistors PD1, PD2; and pass-gate transistors PG1, PG2. As show in the circuit diagram, transistors PU1 and PU2 are p-type transistors, such as the p-type FinFETs discussed above, and transistors PG1, PG2, PD1, and PD2 are n-type FinFETs discussed above.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL.

However, conventional FinFET SRAM devices may still have shortcomings. For example, the source/drains of the transistors of the FinFET SRAM devices may be formed by epitaxially grown layers (also referred to as epi-layers). These epi-layers are epitaxially grown on fin structures and may protrude laterally outward. Metal contacts are formed on these epi-layers to provide electrical connectivity to the source/drain regions of the transistors. As semiconductor feature sizes continue to shrink, the epi-layers also decrease in size, which makes the metal contact landing window small. To enhance the metal contact landing window, it may be desirable to increase the lateral dimensions of the source/drain epi-layers, for example by configuring the epitaxial growth process parameters to make the source/drain epi-layers protrude more outward laterally. However, increasing the lateral protrusion of the source/drain epi-layers may lead to an unintentional merging between the source/drain epi-layers from adjacent transistors (e.g., adjacent pFETs). For SRAM devices, the merging between the source/drain epi-layers from adjacent transistors may mean the electrical shorting between the adjacent transistors, which adversely interferes with the operation of the SRAM device and is therefore undesirable.

Figure 7B:
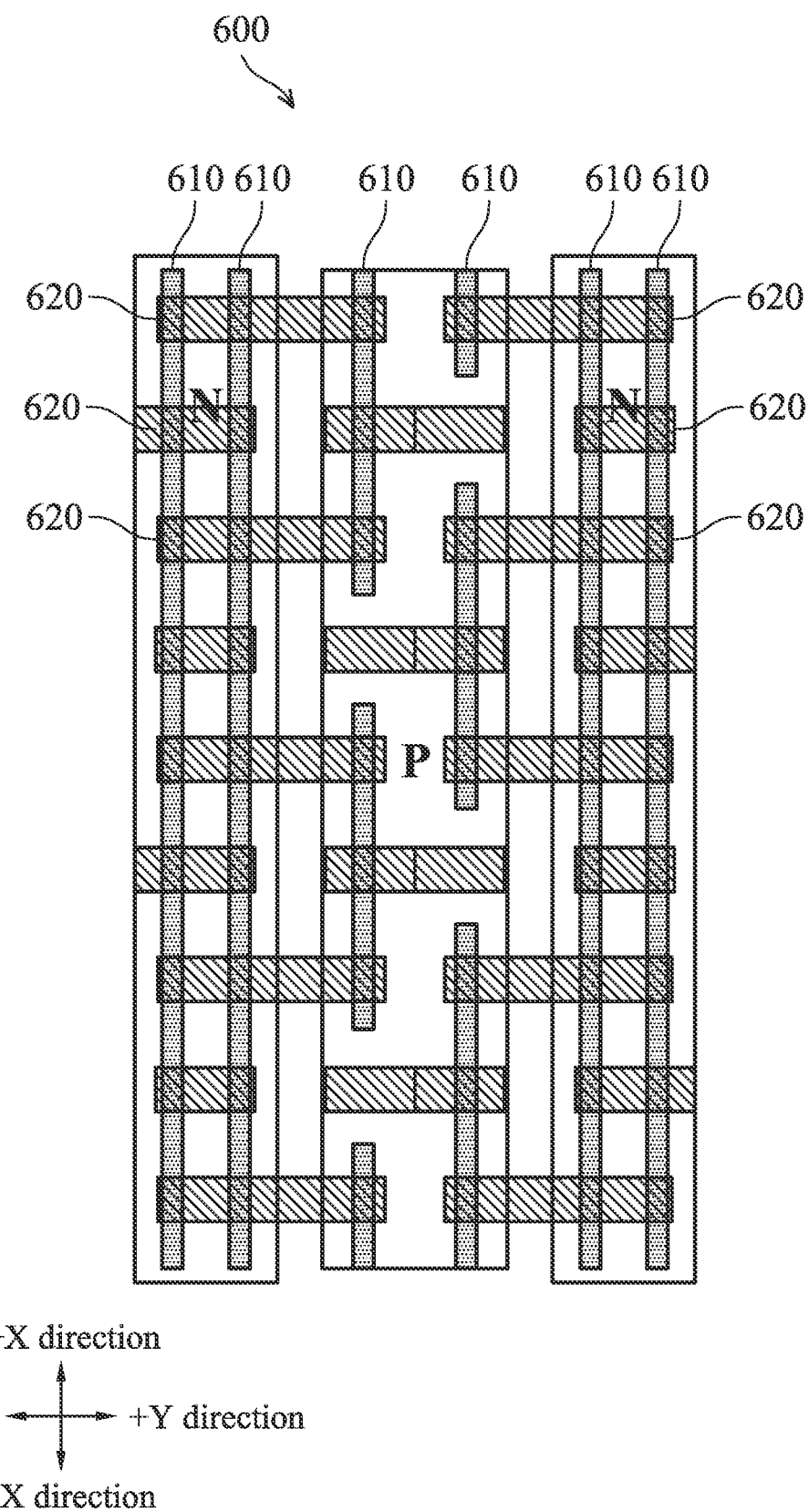
FIG. 7B illustrates a top view layout of a portion of an SRAM cell array according to embodiments of the present disclosure.

FIG. 7B illustrates a top view of an SRAM cells array 600 according to embodiments of the present disclosure. The SRAM cells array 600 includes SRAM cells, for example SRAM cells such as the SRAM cell 90 of FIG. 7A. The SRAM cells array 600 includes N-doped regions (or N-wells) and P-doped regions (or P-wells). In both the N-doped regions and the P-doped regions, the SRAM cells array 600 includes a plurality of fin lines 610 that extend in an elongated manner in the X-direction. The fin structures 150-151 discussed above may be embodiments of the fins 610 in the P-doped regions. The SRAM cells array 600 also includes a plurality of gate structures such as gate structures 620. The gate structures 620 may each wrap around one or more of the fins 610, but in the top view of FIG. 7B, the gate structures 620 are illustrated as extending in a Y-direction that is perpendicular to the X-direction in which the fins 610 extend. The fins 610 and the gate structures 620 form transistors. For example, in an embodiment, the pull-up (PU) transistors of the SRAM cell 90 are formed by the transistors in the N-doped region, and the pull-down (PD) transistors and the pass-gate (PG) transistors are formed by the transistors in the P-doped region.

Figure 8A:
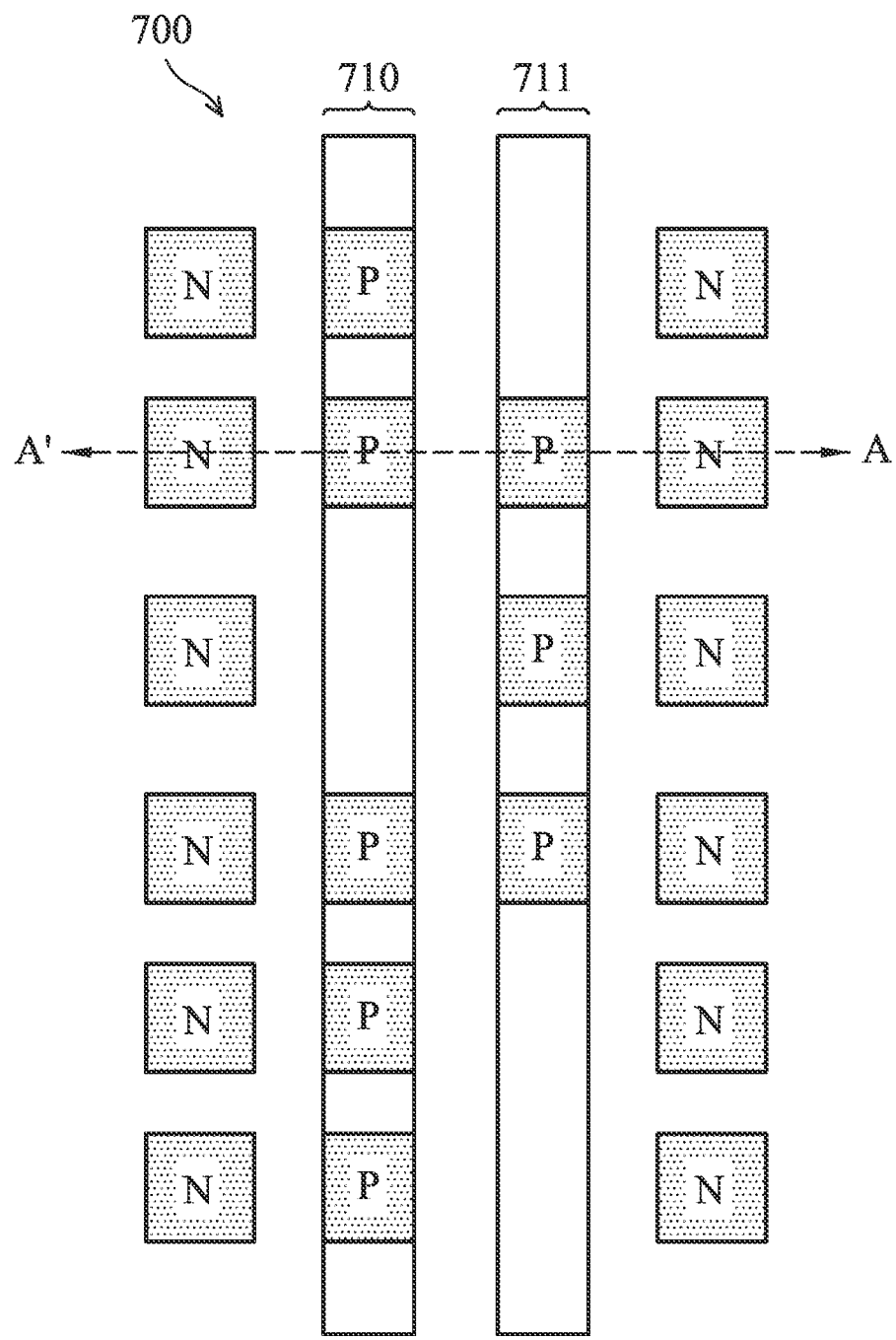
FIG. 8A is a top view of a photomask according to embodiments of the present disclosure.

FIG. 8A is a top view of a portion of a photomask 700 that may be used in the fabrication of the semiconductor device 100 according to embodiments of the present disclosure. It is understood that the photomask 700 may be a single mask in some embodiments, or it may include a plurality of photomasks in other embodiments. In embodiments where the fabrication of the semiconductor device 100 involves EUV lithography, the photomask 700 may also include one or more EUV lithography masks. It is also understood that the photomask 700 is not necessarily drawn to scale unless otherwise specified.

The photomask 700 is used in the patterning of the various components of FinFET SRAM devices, such as the device 100 discussed above in association with FIGS. 2-7. The regions marked with "P" correspond to the p-type regions (e.g., source/drain regions of p-type transistors in an SRAM device), and the regions marked with "N" correspond to the n-type regions (e.g., source/drain regions of n-type transistors in an SRAM device). It is understood that the Y-cut cross-sectional view of FIGS. 2-6 may correspond to the cut along the lines A-A' in FIG. 8A.

In some embodiments, the photomask 700 may be used to define the photoresist layer 230 discussed above with reference to FIG. 2. For example, regions 710 and 711 of the photomask 700 correspond to the openings 270 and 271 of the photoresist layer 230, respectively. In comparison, the photomask for conventional FinFET SRAM devices may merge the regions 710 and 711 into a single region, which means that the photoresist layer 230 would have a single opening instead of the two distinct openings 270 and 271 shown in FIG. 2. As discussed above, by forming a photoresist layer with two separate and distinct openings 270 and 271, the spacers are patterned in a manner such that the spacers between the adjacent fin structures are preserved, which prevents the epitaxial growth of the source/drain epi-layers in the directions toward each other. As such, the two adjacently located P-regions (adjacent to one another in the Y-direction) will not merge together, which would have led to electrical shorting between two transistors of the FinFET SRAM. Meanwhile, the two adjacently located P-regions (e.g., corresponding to the source/drain epi-layers 400 and 401) may still be grown sufficiently in the Y direction away from one another, thereby enlarging the metal contact landing window.

Figure 8B:
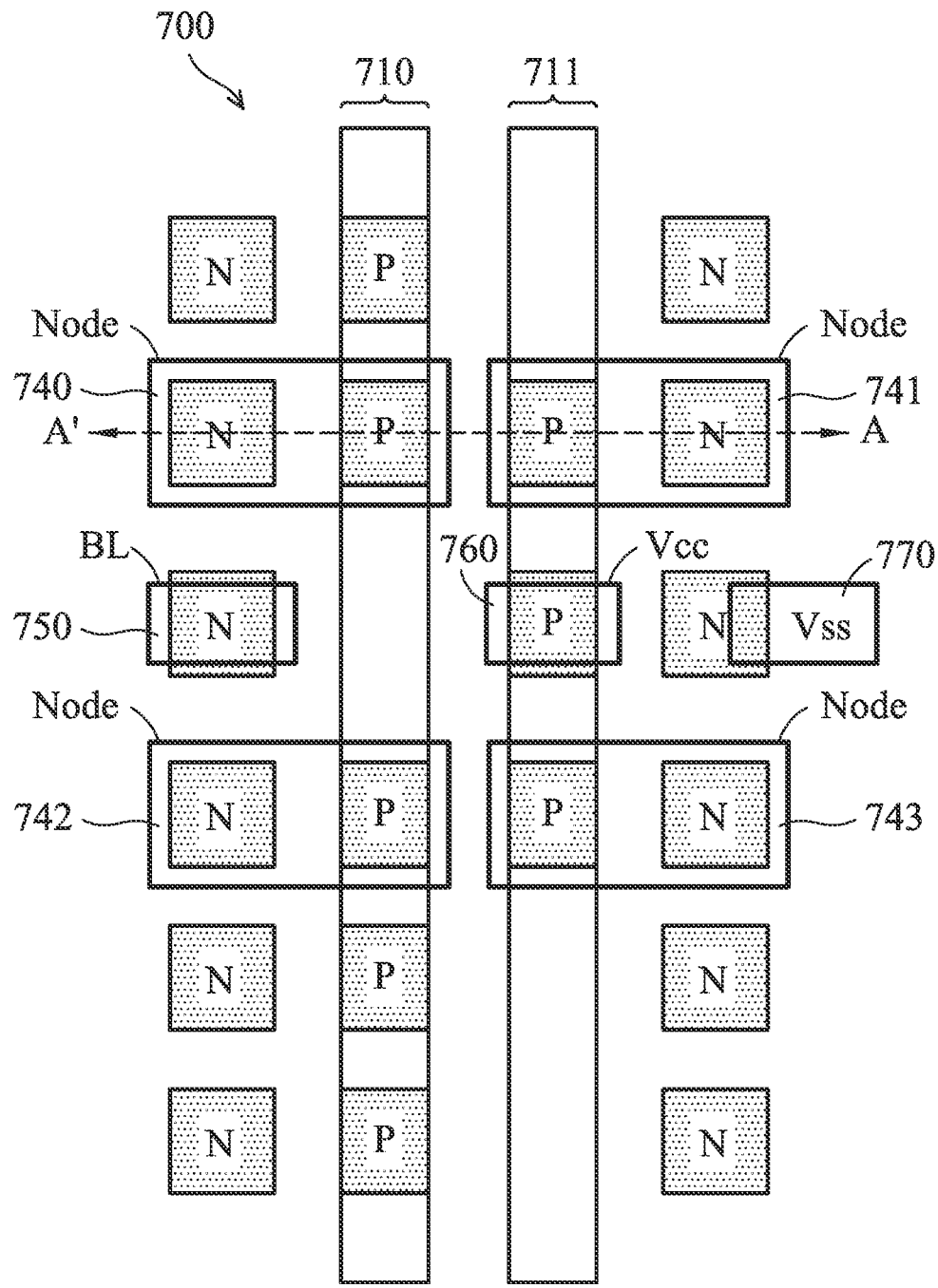
FIG. 8B is the top view of the photomask of FIG. 8A superimposed with metal contacts according to embodiments of the present disclosure.

FIG. 8B illustrates the photomask 700 of FIG. 8A but with the locations of some metal contacts (of the SRAM cell) superimposed thereover. For example, FIG. 8B illustrates node (e.g., storage node) contacts 740, 741, 742, and 743, as well as a bit-line (BL) contact 750, a Vcc contact 760, and a Vss contact 770. In some embodiments, the metal contacts 550 and 551 (discussed above with reference to FIG. 6) may be embodiments of the node contacts 740 and 741, respectively, or embodiments of the node contacts 742 and 732, respectively. From the top view of FIG. 8B, it can be seen that if the P regions below the node contacts 740 and 741 (or the node contacts 742-743) are too close to each other, there may be a merging risk, which is undesirable as discussed above. Again, the present disclosure reduces the merging risks by patterning the spacers in a manner so as to force the adjacently epitaxially grown source/drains to protrude laterally in directions away from each other, but not toward each other. Consequently, the SRAM devices fabricated according to the various aspects of the present disclosure may have improved performance and reduced failure rate. It is understood that although the present disclosure uses an SRAM to illustrate a situation where merging risks are present, the concepts discussed herein may apply to other types of semiconductor devices as well, for example to semiconductor devices that have components located sufficiently close to one another.

Figure 9:
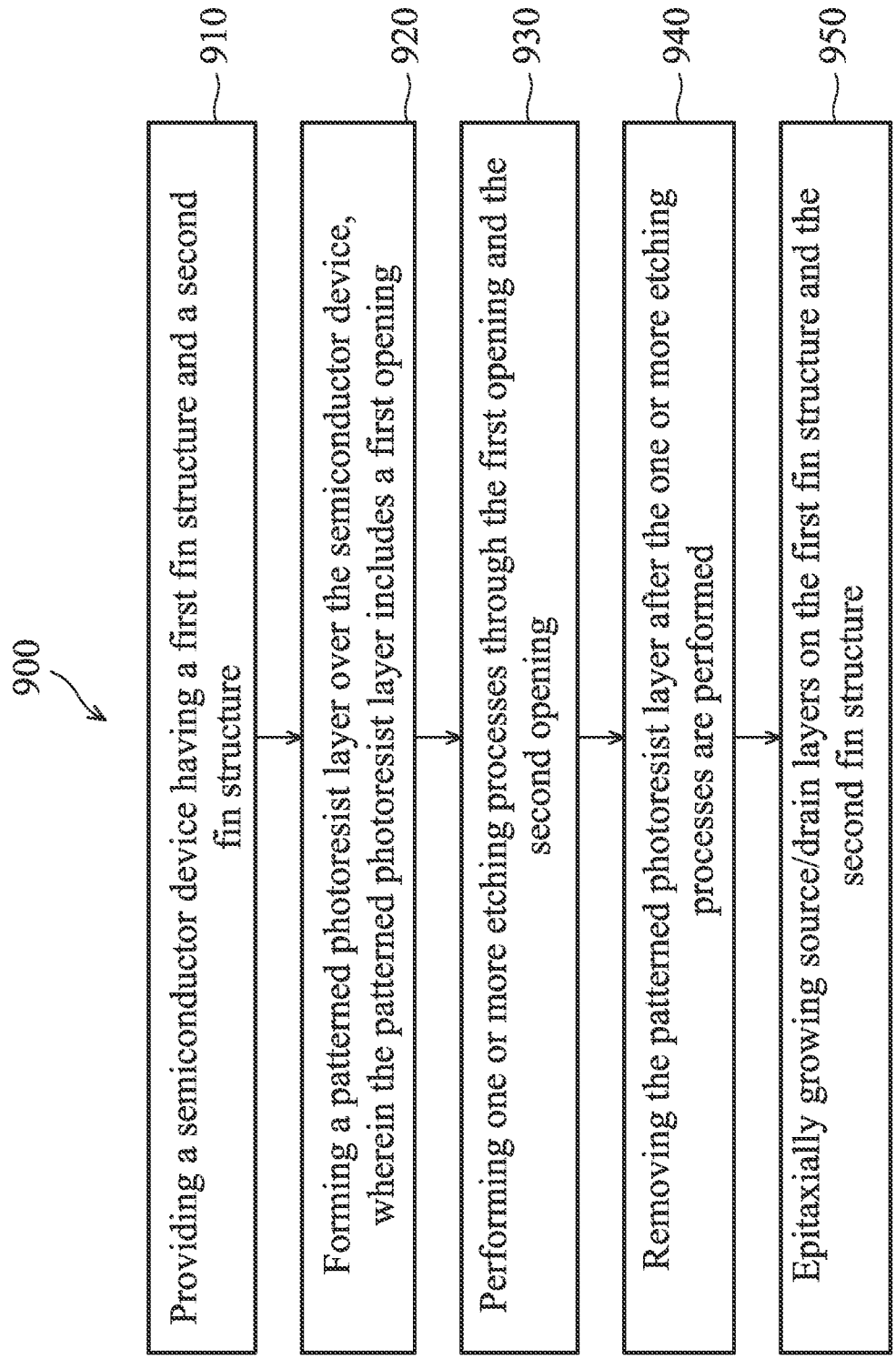
FIG. 9 is a flowchart illustrating a method of fabricating a FinFET SRAM device according to an embodiment of the present disclosure.

FIG. 9 is a flowchart illustrating a method 900 according to an embodiment of the present disclosure. The method 900 includes a step 910, in which a semiconductor device is provided. The semiconductor device has a first fin structure and a second fin structure that each protrude vertically upwards out of a semiconductive layer. A spacer layer is formed on sidewalls of the first fin structure and the second fin structure.

The method 900 includes a step 920, in which a patterned photoresist layer is formed over the semiconductor device. The patterned photoresist layer includes a first opening exposing the first fin structure and a second opening exposing the second fin structure. A portion of the patterned photoresist layer is formed to cover up segments of the spacer layer located between the first fin structure and the second fin structure.

The method 900 includes a step 930 of performing one or more etching processes through the first opening and the second opening. The portion of the patterned photoresist layer protects the segments of the spacer layer underneath from being etched.

The method 900 includes a step 940 of removing the patterned photoresist layer after the one or more etching processes are performed.

The method 900 includes a step 950 of epitaxially growing source/drain layers on the first fin structure and the second fin structure. The segments of the spacer layer prevent a lateral growth of the source/drain layers of the first fin structure and the second fin structure toward each other. In some embodiments, the epitaxially growing comprises epitaxially growing source/drain layers of FinFET transistors of an SRAM device. In some embodiments, the epitaxially growing comprises epitaxially growing source/drain layers of p-type FinFET transistors. In some embodiments, the epitaxially growing is performed such that the source/drain layers of the first fin structure and the second fin structure protrude laterally away from each other. In some embodiments, the epitaxially growing is performed such that the source/drain layers of the first fin structure and the second fin structure each have an asymmetrical shape.

It is understood that additional processes may be performed before, during, or after the steps 910-950 of the method 900. For example, the method 900 may include a step of forming metal contacts on the source/drain layers. For reasons of simplicity, other additional steps are not discussed herein in detail.

Based on the above discussions, it can be seen that the present disclosure describes a solution to the problem of merging transistors as device sizes shrink. For example, for a FinFET SRAM device, some adjacent transistors may have merging risks. The merging risks may be exacerbated by the need to increase a metal contact landing window, since it may be desirable to increase the lateral dimension of the source/drain epi-layers of the transistor. In more detail, increasing the lateral dimensions of the source/drain epi-layers may cause the source/drain epi-layers between adjacent transistors to merge together, thereby shorting the inverters of the SRAM. The present disclosure solves this problem by preserving a portion of the spacer layer between the adjacent transistors. According to the present disclosure, during a patterning process, portions of the spacers between the adjacent transistors are preserved. In one embodiment, this is accomplished by configuring a photomask according to FIG. 8. The preserved spacers prevent the lateral epitaxial growth of the source/drain layers in the direction towards each other, but the source/drain epi-layers are still free to grow laterally in the directions facing away from each other. Therefore, the source/drain layers can still be grown to be large enough for the metal contact landing window, without risking merging between the source/drain layers of adjacent transistors. As a result, the source/drain epi-layers of the adjacently-located transistors herein may have an asymmetric profile, such that they lateral protrude in directions away from each other, but they have little, if any, lateral protrusion in the directions facing each other. In other words, some of the side surfaces of the epi-layers for these adjacently-located transistors may exhibit a lateral protrusion profile, while other side surfaces of the epi-layers may exhibit a substantially flatter profile. The asymmetrical profile of the source/drain epi-layers may be a unique characteristic of transistors that undergo the fabrication processes discussed above.

Based on the above discussions, it can be seen that the present disclosure offers advantages over conventional FinFET SRAM devices. It is understood, however, that other embodiments may offer additional advantages, and not all advantages are necessarily disclosed herein, and that no particular advantage is required for all embodiments. One advantage is that the present disclosure prevents undesirable merging between the source/drain epi-layers from adjacent transistors. For example, a FinFET SRAM device layout may call for two p-type transistors to be located adjacent to each other. If the source/drain epi-layers from these transistors are merged together, it may cause the electrical shorting between inverters of the SRAM, for example. The present disclosure obviates this problem by preventing spacers (that are located between the adjacent transistors) from being etched away. These spacers will block the lateral growth of the source/drain epi-layers in directions toward each other.

Another advantage of the present disclosure is that it can enlarge the metal contact landing window. Metal contacts are formed on the source/drain epi-layers to provide electrical connectivity to the transistors. As device feature sizes become smaller, it may be more difficult to accurately align the metal contacts with the source/drain epi-layers. Therefore, it is desirable to have a wide source/drain epi-layer, so that if there is any misalignment, the metal contacts can still "land" on the source/drain epi-layers. For conventional FinFET SRAM devices, due to the merging concerns discussed above, the source/drain epi-layers cannot be formed too wide, and unfortunately this reduces the metal contact landing window. In comparison, the present disclosure prevents the merging between source/drain epi-layers, and consequently the source/drain epi-layers can be formed to have a wide lateral dimension (e.g., growing in a direction away from the adjacent transistor). In this manner, the metal contact landing window is enlarged.

Other advantages include compatibility with existing FinFET SRAM design and manufacture, so the present disclosure does not require additional processing and is therefore easy and cheap to implement.

One aspect of the present disclosure pertains to a semiconductor device. The semiconductor device includes a layer that includes a semiconductive material. The layer includes an outwardly-protruding fin structure. An isolation structure is disposed over the layer but not over the fin structure. A first spacer and a second spacer are each disposed over the isolation structure and on opposite sidewalls of the fin structure. The first spacer is disposed on a first sidewall of the fin structure. The second spacer is disposed on a second sidewall of the fin structure opposite the first sidewall. The second spacer is substantially taller than the first spacer. An epi-layer is grown on the fin structure. The epi-layer protrudes laterally. A lateral protrusion of the epi-layer is asymmetrical with respect to the first side and the second side.

Another one aspect of the present disclosure pertains to a semiconductor device. The semiconductor device includes a layer that includes a semiconductive material. The layer includes a first fin structure and a second fin structure that each protrude vertically upwards. A dielectric structure is located over the layer. A portion of the dielectric structure is located between the first fin structure and the second fin structure. A first epi-layer is epitaxially grown on the first fin structure. A second epi-layer is epitaxially grown on the second fin structure. The second epi-layer is spaced apart from the first epi-layer. The first epi-layer protrudes laterally in a first direction away from the second epi-layer. The second epi-layer protrudes laterally in a second direction away from the first epi-layer, the second direction being opposite the first direction.

Yet another aspect of the present disclosure pertains to a method of fabricating a semiconductor device. A semiconductor device is provided. The semiconductor device has a first fin structure and a second fin structure that each protrude vertically upwards out of a semiconductive layer. A spacer layer is formed on sidewalls of the first fin structure and the second fin structure. A patterned photoresist layer is formed over the semiconductor device. The patterned photoresist layer includes a first opening exposing the first fin structure and a second opening exposing the second fin structure. A portion of the patterned photoresist layer is formed to cover up segments of the spacer layer located between the first fin structure and the second fin structure. One or more etching processes are performed through the first opening and the second opening. The portion of the patterned photoresist layer protects the segments of the spacer layer underneath from being etched. The patterned photoresist layer is removed after the one or more etching processes are performed. Source/drain layers are epitaxially grown on the first fin structure and the second fin structure. The segments of the spacer layer prevent a lateral growth of the source/drain layers toward each other.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A method, comprising:
providing a semiconductor structure having a first fin structure and a spacer layer disposed on a first sidewall and a second sidewall of the first fin structure;
forming a patterned photoresist layer over a first portion of the spacer layer disposed on the second sidewall of the first fin structure;
etching the first fin structure and a second portion of the spacer layer disposed on the first sidewall of the first fin structure using the patterned photoresist layer as an etch mask; and
after the etching, epitaxially growing a source/drain layer on the first fin structure, wherein the source/drain layer protrudes more over the second portion of the spacer layer than over the first portion of the spacer layer.

2. The method of claim 1, wherein the spacer layer comprises:
a first spacer layer comprising a low-k dielectric material; and
a second spacer layer over the first spacer layer, the second spacer layer comprising silicon nitride.

3. The method of claim 1, wherein, after the etching, a height of the first portion of the spacer layer is greater than a height of the second portion of the spacer layer.

4. The method of claim 1,
wherein the semiconductor structure further comprises a second fin structure alongside the first fin structure, a distance between the second portion of the spacer layer and the second fin structure being greater than a distance between the first portion of the spacer layer and the second fin structure,
wherein the source/drain layer comprises a first surface closer to the second fin structure and a second surface away from the second fin structure,
wherein a profile of the first surface is different from a profile of the second surface.

5. The method of claim 4,
wherein the first surface is substantially straight,
wherein the second surface comprises a protrusion.

6. The method of claim 1, wherein the source/drain layer comprises silicon, germanium and a p-type dopant.

7. The method of claim 1, further comprising:
before the epitaxially growing, removing the patterned photoresist layer.

8. The method of claim 1, further comprising:
after the removing of the patterned photoresist layer, performing a cleaning process to remove contaminants from the first fin structure.

9. A method comprising:
providing a semiconductor structure having a first fin, a second fin, a spacer layer, the spacer layer comprising a first outer portion disposed on a sidewall of the first fin, a second outer portion disposed on a sidewall of the second fin, and an inner portion disposed between the first fin and the second fin;
forming a patterned photoresist layer over the inner portion to expose the first outer portion, the first fin, the second outer portion, and the second fin;
recessing the first fin, the second fin, the first outer portion, and the second outer portion while the inner portion is protected by the patterned photoresist layer;
cleaning the recessed first fin and the recessed second fin; and
epitaxially growing a first source/drain layer on the first fin and a second source/drain layer on the second fin, wherein each of the first source/drain layer and the second source/drain layer comprises an asymmetric cross-sectional profile,
wherein the first source/drain layer mirrors the second source/drain layer.

10. The method of claim 9, wherein the spacer layer comprises:
a first spacer layer; and
a second spacer layer over the first spacer layer,
wherein a composition of the first spacer layer is different from a composition of the second spacer layer.

11. The method of claim 10, further comprising:
after the epitaxially growing, selectively removing the second spacer layer while the first spacer layer is substantially unetched.

12. The method of claim 11, wherein the selectively removing comprises use of phosphoric acid.

13. The method of claim 11, further comprising:
after the selectively removing of the second spacer layer, forming an isolation structure over the first spacer layer in the inner portion.

14. The method of claim 9, wherein the recessing comprises:
performing a first etching process to etch the first fin and the second fin; and
performing a second etching process to etch the first outer portion and the second outer portion.

15. The method of claim 9,
wherein the first source/drain layer comprises a first protrusion pointing away from the second fin,
wherein the second source/drain layer comprises a second protrusion pointing away from the first fin.

16. A method, comprising:
providing a semiconductor device having a first fin structure and a second fin structure that each protrude vertically upwards out of a semiconductive layer, wherein a spacer layer is formed on sidewalls of the first fin structure and the second fin structure;
forming a patterned photoresist layer over the semiconductor device, wherein the patterned photoresist layer includes a first opening exposing the first fin structure and a second opening exposing the second fin structure, and wherein a portion of the patterned photoresist layer is formed to cover up segments of the spacer layer located between the first fin structure and the second fin structure;
performing one or more etching processes through the first opening and the second opening, wherein the portion of the patterned photoresist layer protects the segments of the spacer layer underneath from being etched;
removing the patterned photoresist layer after the one or more etching processes are performed; and
epitaxially growing source/drain layers on the first fin structure and the second fin structure, wherein the segments of the spacer layer prevent a lateral growth of the source/drain layers toward each other.

17. The method of claim 16, wherein the epitaxially growing comprises epitaxially growing source/drain layers of FinFET transistors of an SRAM device.

18. The method of claim 17, wherein the epitaxially growing comprises epitaxially growing source/drain layers of p-type FinFET transistors.

19. The method of claim 16, wherein the epitaxially growing is performed such that the source/drain layers of the first fin structure and the second fin structure protrude laterally away from each other.

20. The method of claim 16, wherein the epitaxially growing is performed such that the source/drain layers of the first fin structure and the second fin structure each have an asymmetrical shape.

* * * * *